United States Patent
Naruse et al.

(10) Patent No.: US 8,508,640 B2
(45) Date of Patent: Aug. 13, 2013

(54) SOLID-STATE IMAGING DEVICE AND METHOD FOR DRIVING THE SAME

(75) Inventors: Junji Naruse, Yokohama (JP); Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/970,160

(22) Filed: Dec. 16, 2010

(65) Prior Publication Data

US 2011/0141333 A1  Jun. 16, 2011

(30) Foreign Application Priority Data

Dec. 16, 2009  (JP) .................. 2009-285420

(51) Int. Cl.
*H04N 3/14* (2006.01)
*H04N 5/335* (2011.01)

(52) U.S. Cl.
USPC ............................... 348/308; 348/294

(58) Field of Classification Search
USPC ............ 348/222.1, 294, 302, 308; 250/208.1
See application file for complete search history.

(56) References Cited

U.S. PATENT DOCUMENTS

| | | | |
|---|---|---|---|
| 7,349,024 B2 * | 3/2008 | Oda et al. ....................... | 348/370 |
| 2005/0064613 A1 * | 3/2005 | Takeuchi et al. ................ | 438/24 |
| 2005/0092894 A1 * | 5/2005 | Fossum ....................... | 250/208.1 |
| 2008/0203452 A1 * | 8/2008 | Moon et al. .................. | 257/292 |
| 2009/0256226 A1 * | 10/2009 | Tatani et al. .................. | 257/432 |
| 2011/0175981 A1 * | 7/2011 | Lai et al. ....................... | 348/46 |

FOREIGN PATENT DOCUMENTS

JP        2008-99073        4/2008

OTHER PUBLICATIONS

U.S. Appl. No. 12/828,718, filed Jul. 1, 2010, Nagataka Tanaka, et al.

* cited by examiner

*Primary Examiner* — Gevell Selby

(74) *Attorney, Agent, or Firm* — Oblon, Spivak, McClelland, Maier & Neustadt, L.L.P.

(57) ABSTRACT

According to one embodiment, a back side illumination type solid-state imaging device includes an imaging area in which a plurality of unit pixels each including a photoelectric conversion section and a signal scan circuit section are arranged on a semiconductor substrate, and a light illumination surface formed on a surface of the semiconductor substrate located opposite a surface of the semiconductor substrate on which the signal scan circuit section is formed, wherein the unit pixel comprises a high-sensitivity pixel and a low-sensitivity pixel with a lower sensitivity than the high-sensitivity pixel. And each of the high-sensitivity pixel and the low-sensitivity element comprises a first pixel separation layer located on the light illumination surface side in the semiconductor substrate to separate the pixels from each other.

18 Claims, 15 Drawing Sheets

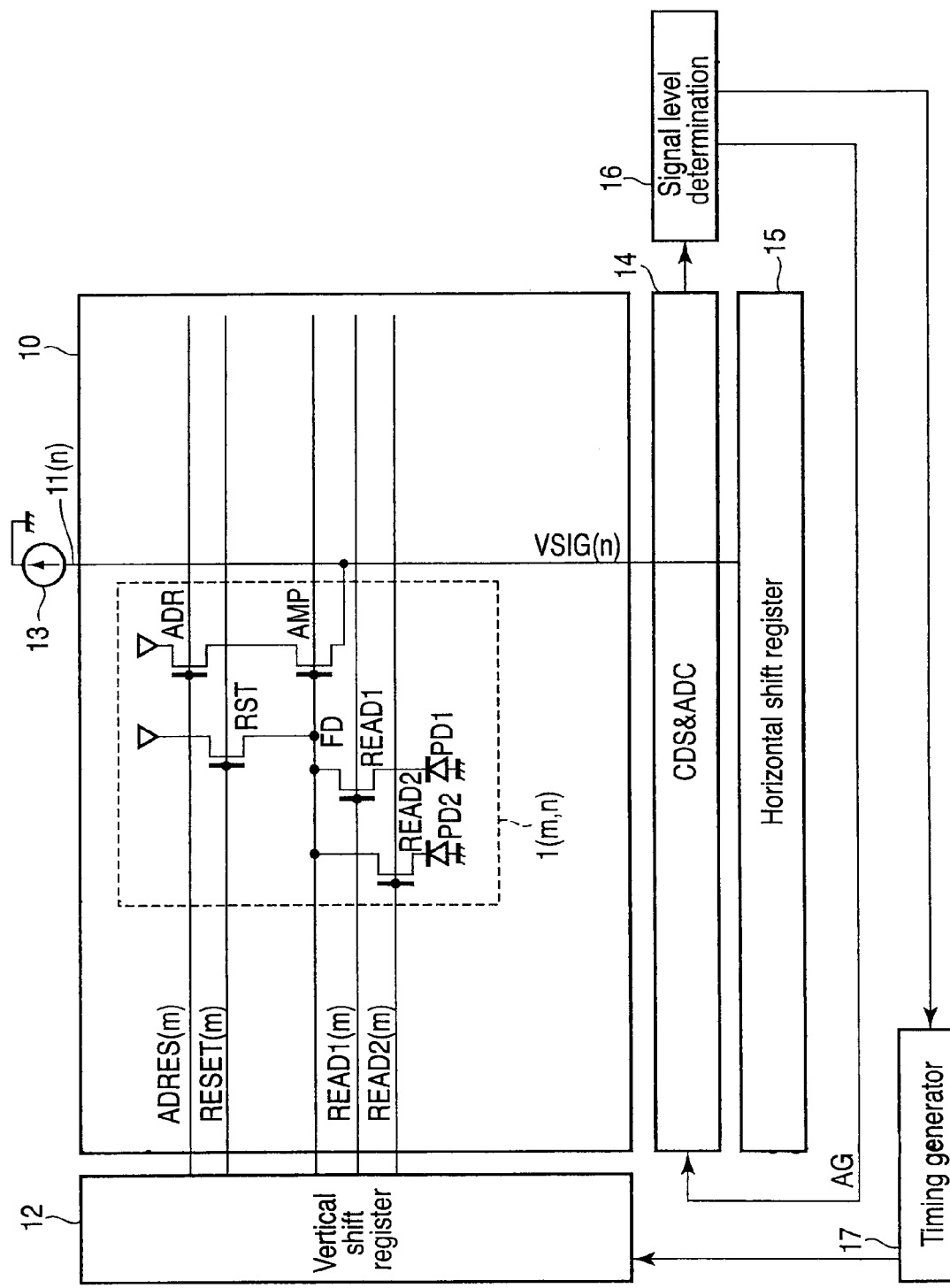
F I G. 1

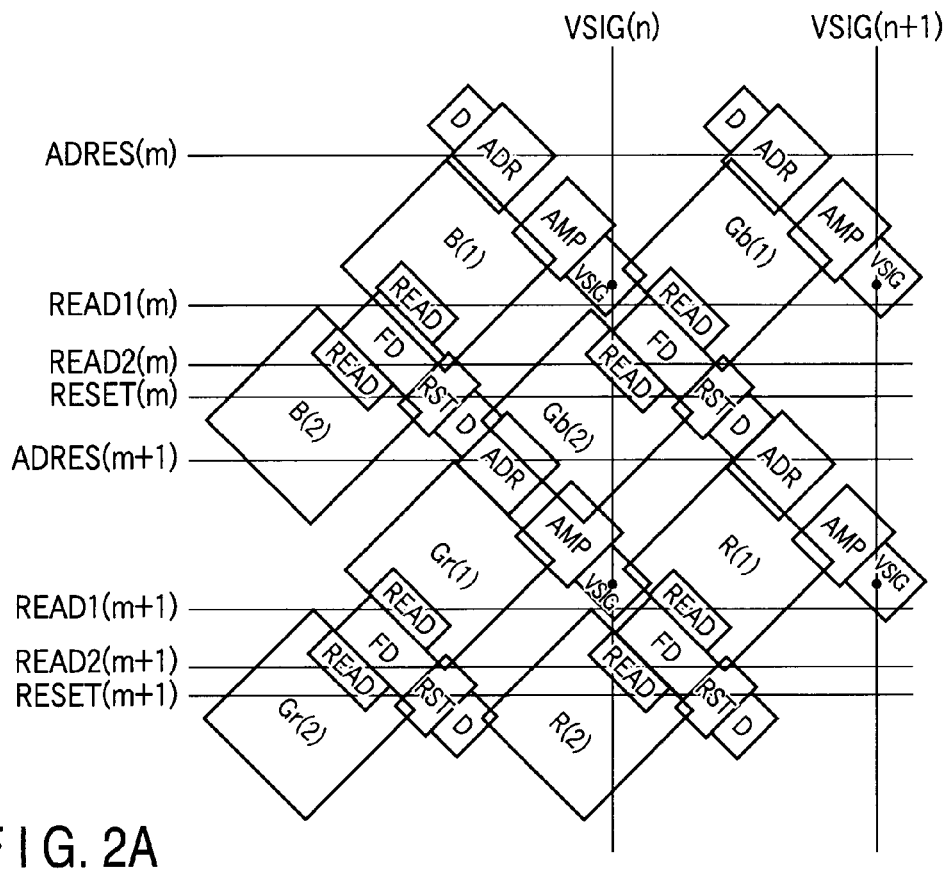
F I G. 2A
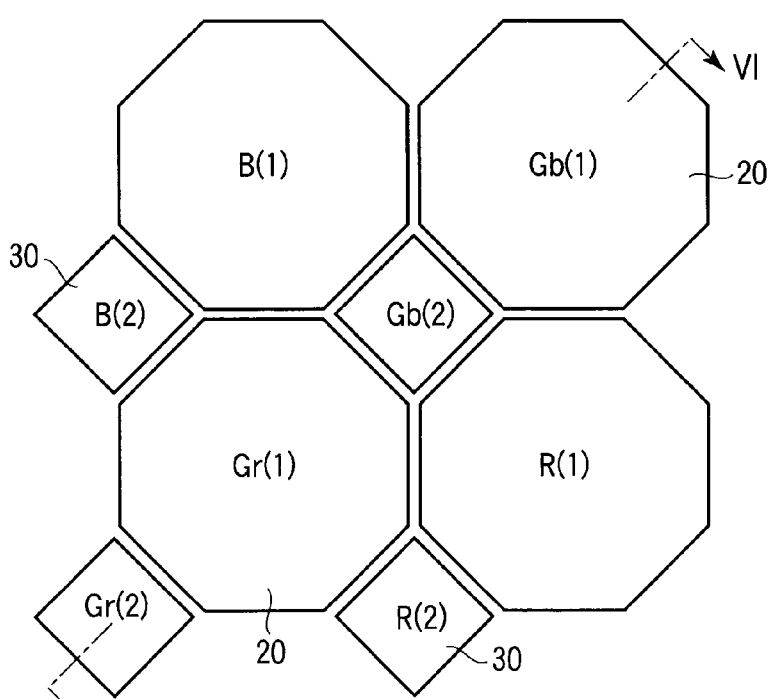
F I G. 2B

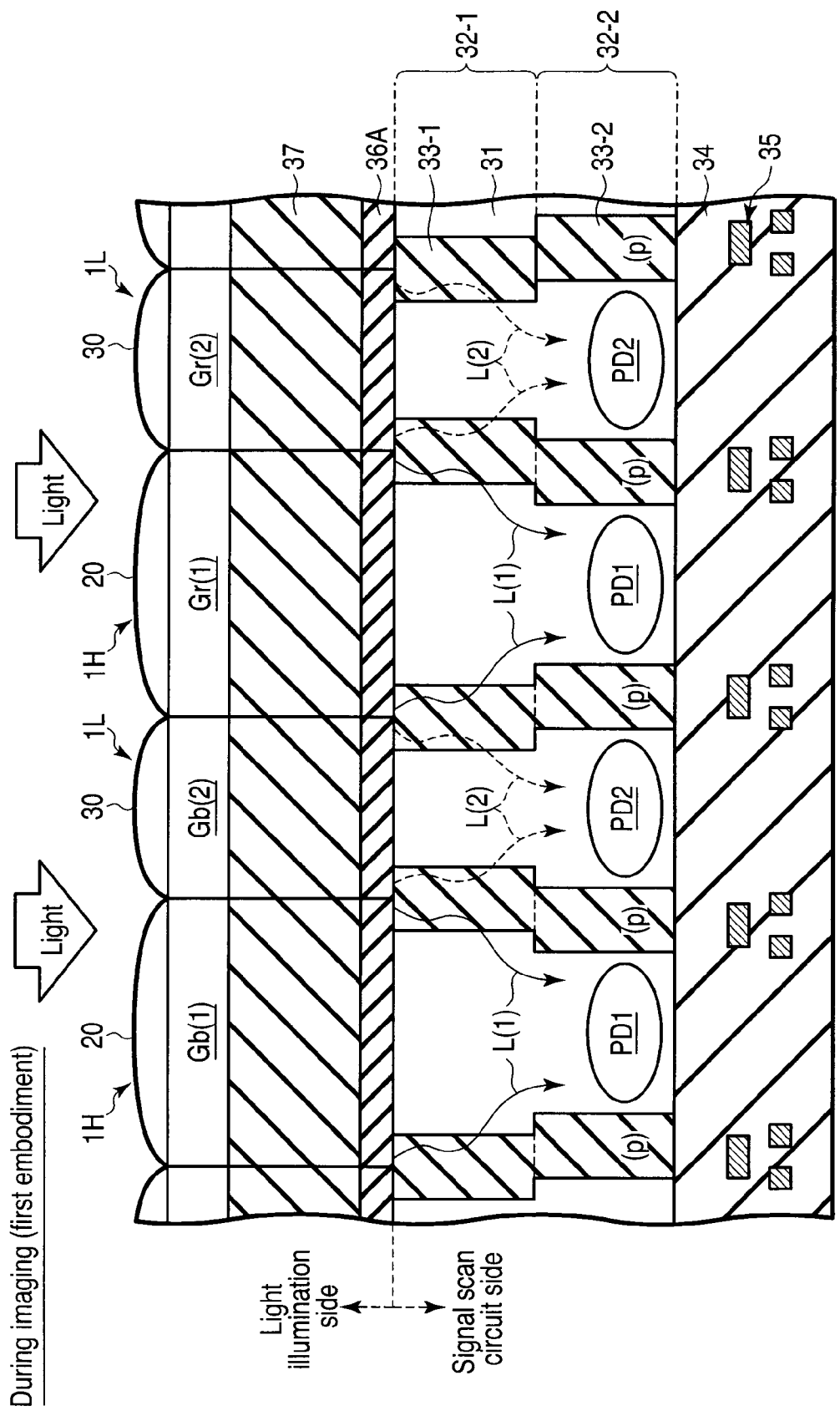
F I G. 7

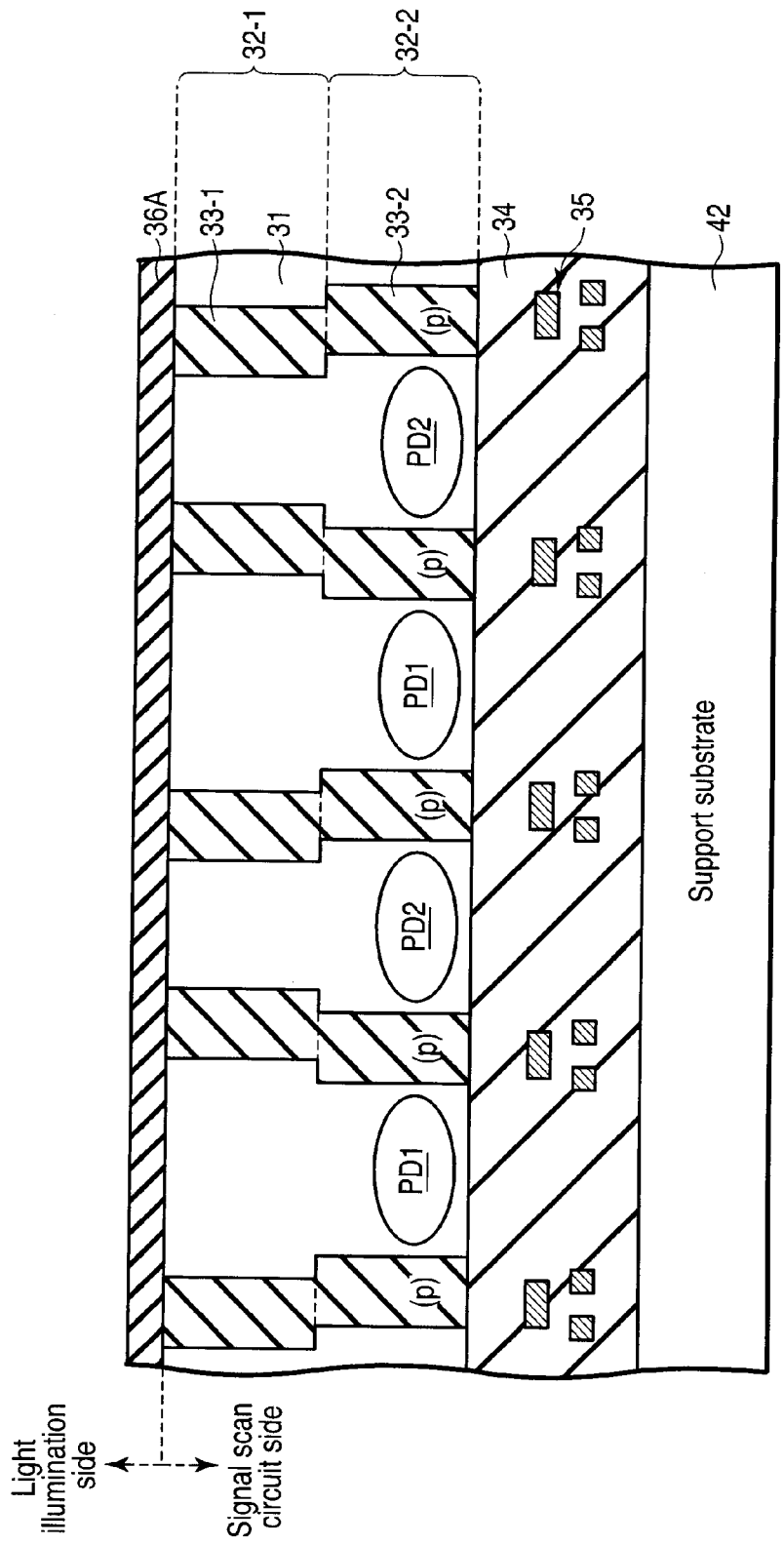
F I G. 12

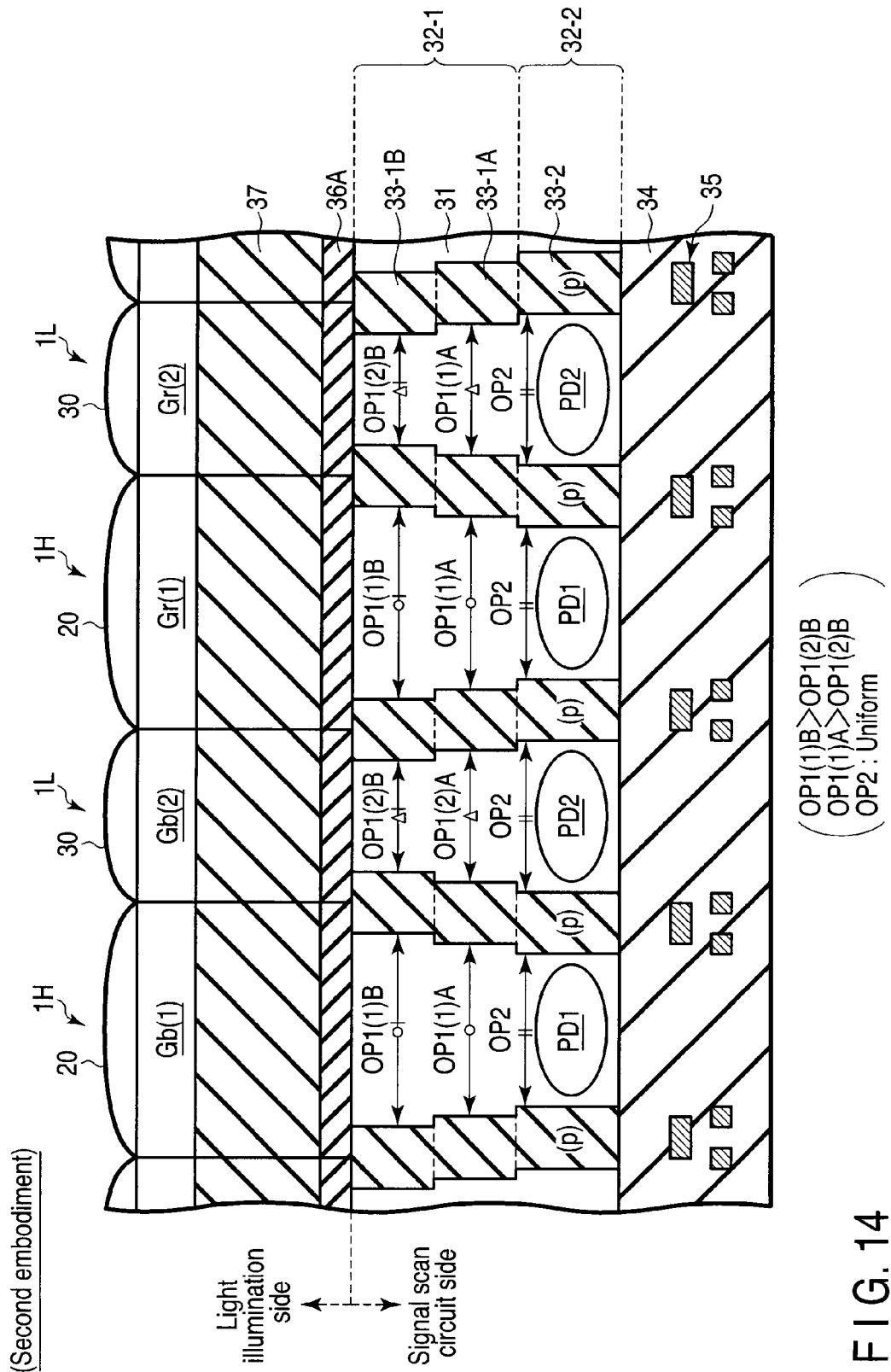
F I G. 14

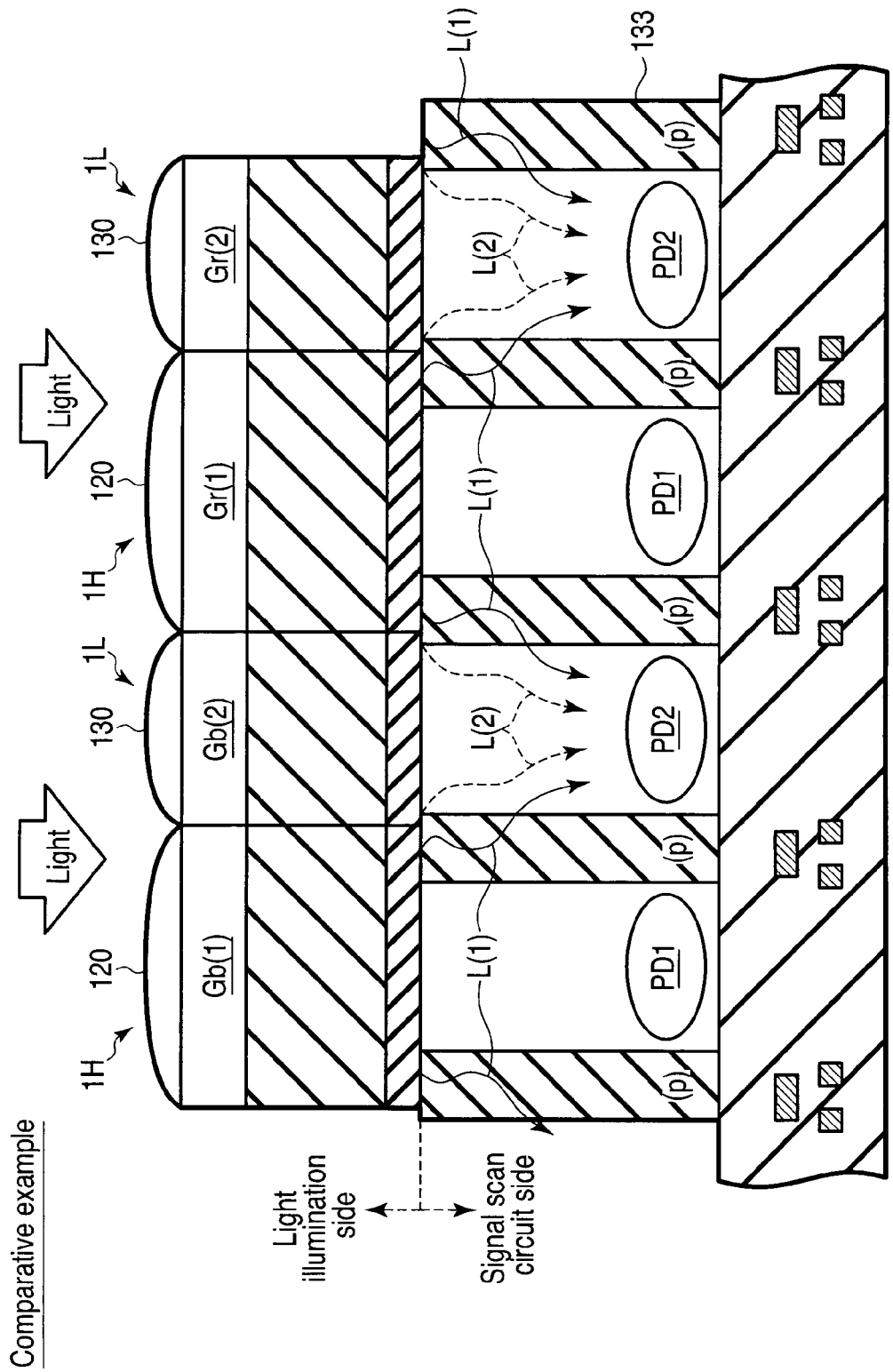
F I G. 15

SOLID-STATE IMAGING DEVICE AND METHOD FOR DRIVING THE SAME

CROSS-REFERENCE TO RELATED APPLICATIONS

This application is based upon and claims the benefit of priority from Japanese Patent Application No. 2009-285420, filed Dec. 16, 2009; the entire contents of which are incorporated herein by reference.

FIELD

Embodiments described herein relate generally to a solid-state imaging device, a method for driving the solid-state imaging device, and the like.

BACKGROUND

In solid-state imaging devices such as CMOS image sensors, back side illumination type solid-state imaging devices have gathered much attention because these solid-state imaging device are expected to allow pixels to be miniaturized and to improve the sensitivity of the pixels.

Besides the reduced size and improved sensitivity of pixels, for example, a dynamic range is an important characteristic (e.g., Jpn. Pat. Appln. KOKAI Publication No. 2008-099073).

BRIEF DESCRIPTION OF THE DRAWINGS

FIG. 1 is a block diagram schematically showing a CMOS image sensor according to a first embodiment;

FIG. 2A and FIG. 2B are a diagram schematically showing a layout image of an element formation area and a gate which correspond to a part of an imaging area of the CMOS image sensor in FIG. 1, and a diagram schematically showing a layout image of color filters and micro lenses;

FIG. 7 is a sectional view illustrating incident light during imaging in the sectional configuration shown in FIG. 6;

FIG. 12 is a sectional view showing a step of manufacturing a solid-state imaging device according to the first embodiment;

FIG. 14 is a sectional view showing a solid-state imaging device according to a second embodiment; and FIG. 15 is a sectional view showing a solid-state imaging device according to a comparative example.

DETAILED DESCRIPTION

Figure 3:
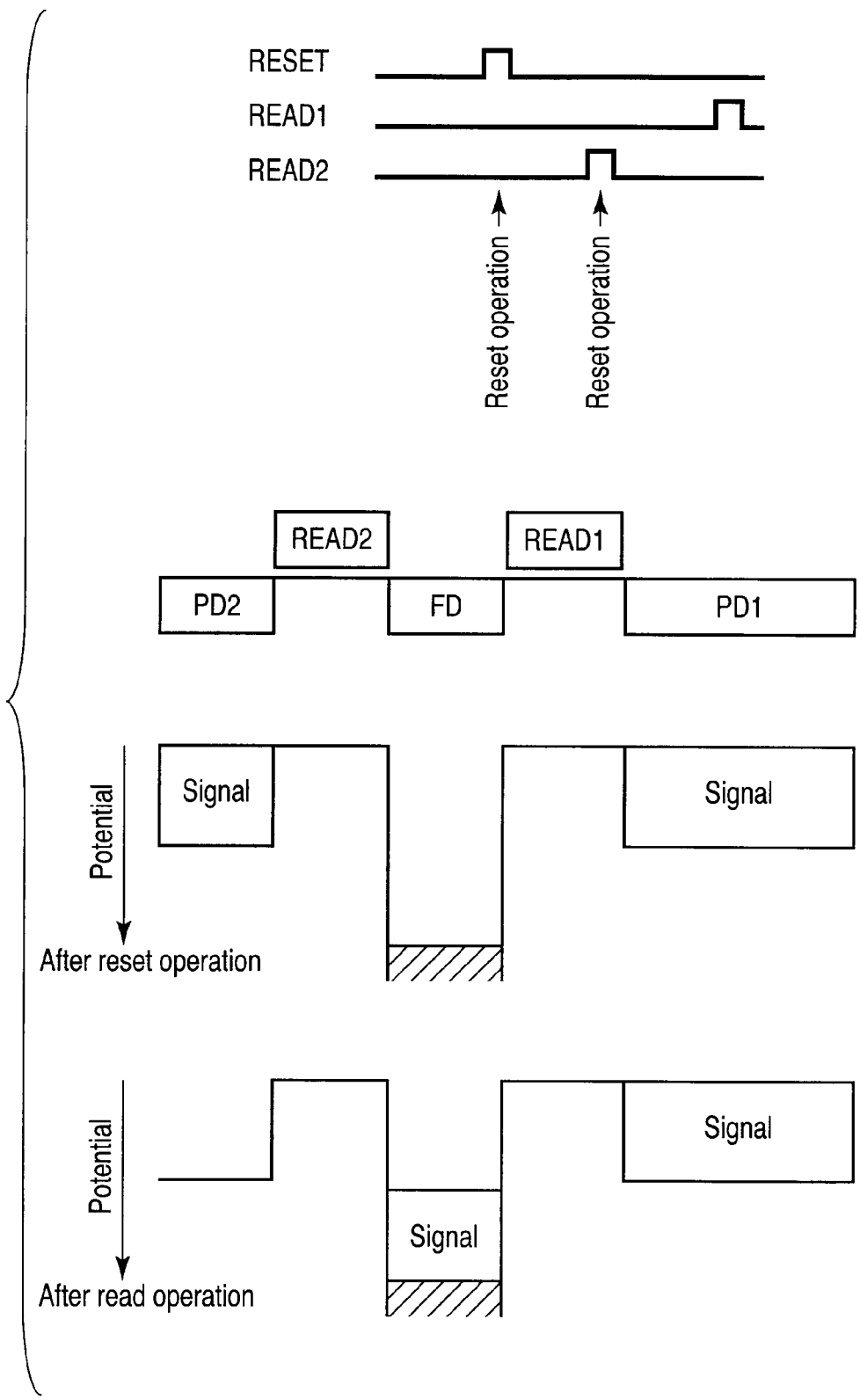
FIG. 3 is a diagram showing an example of operation timings for pixels in a low-sensitivity mode suitable for the case of a large quantity of signal charge accumulated in photo diodes in each unit pixel in FIG. 1 (bright time), as well as potentials in a semiconductor substrate during a reset operation and during a read operation.

In general, according to one embodiment, a back side illumination type solid-state imaging device includes an imaging area in which a plurality of unit pixels each including a photoelectric conversion section and a signal scan circuit section are arranged on a semiconductor substrate, and a light illumination surface formed on a surface of a semiconductor substrate located opposite a surface of the semiconductor substrate on which the signal scan circuit section is formed. Each of the unit pixels comprises a high-sensitivity pixel and a low-sensitivity pixel with a lower sensitivity than the high-sensitivity pixel. Each of the high-sensitivity pixel and the low-sensitivity element comprises a first pixel separation layer located on the light illumination surface side in the semiconductor substrate to separate the pixels from each other. On the light illumination side of the semiconductor substrate, an opening between the first pixel separation layers in the high-sensitivity pixel is larger than an opening between the first pixel separation layers in the low-sensitivity pixel.

A technique to realize a high dynamic range using two types of pixels, that is, a high-sensitivity pixel and a low-sensitivity pixel with different pixel openings (sensitivities) has been proposed.

However, when high-sensitivity pixels and low-sensitivity pixels with different pixel openings (sensitivities) are formed in a back side illumination type solid-state imaging device, a color filter and a micro lens which are large in area need to be formed on each high-sensitivity pixel. Thus, light incident through the high-sensitivity pixel enters a diffusion layer that separates the photo diodes from each other in each pixel. Owing to a small field gradient in the diffusion layer itself, carriers photoelectrically converted by the diffusion layer migrate to the adjacent low-sensitivity pixel. This results in carrier crosstalk.

Thus, the following tendency is observed. Light incident from the high-sensitivity pixel cannot be prevented from entering the diffusion layer, which separates the photo diodes in each pixel, as well as the low-sensitivity pixel. As a result, crosstalk occurs.

Thus, an embodiment will be described below with reference to the drawings. The embodiment will be described taking, by way of example, a back side illumination (BSI) type solid-state imaging device in which a light illumination surface is located on a surface (back surface) of a semiconductor substrate located opposite a surface (front surface) of the semiconductor substrate on which a signal scan circuit and a wiring layer for the signal scan circuit are arranged. In the back side illumination type solid-state imaging device, light incident on the pixel can reach a light reception area in the semiconductor substrate without being hindered by the wiring layer and the like. Thus, even fine pixels enable a high quantization efficiency to be achieved. In the description, common components are denoted by common reference numerals throughout the drawings.

First Embodiment

1. Configuration and Operation

First, with reference to FIG. 1 to FIG. 5, the configuration and operation of a solid-state imaging device according to a first embodiment will be described. FIG. 1 is a block diagram schematically showing a CMOS image sensor according to the first embodiment of the solid-state imaging device. In the CMOS image sensor, an imaging area 10 includes a plurality of unit pixels (unit cells) 1(m, n) arranged in m rows and n columns. The figures representatively show one of the unit pixels 1(m, n) in m rows and n columns and one of vertical signal lines 11(n) formed in a column direction in association with each column in the imaging area.

A vertical shift register 12 is located at one end (the left side of FIG. 1) of the imaging area 10 to supply each row in the imaging area with pixel driving signals such as ADRES(m), RESET(m), READ1(m), and READ2(m).

A current source 13 connected to a vertical signal line 11(n) in each column is located at an upper end (the upper side of FIG. 1) of the imaging area 10. The current source 13 operates as a part of a pixel source follower circuit.

CDS & ADC 14 and a horizontal shift register 15 are arranged at a lower end (the lower side of FIG. 1) of the imaging area; CDS & ADC is connected to the vertical signal line 11(n) in each column and includes a correlated double sampling (CDS) circuit and an analog digital convert (ADC) circuit. CDS & ADC 14 carries out CDS processing on an analog output from the pixel to convert the analog output into a digital output.

A signal level determination circuit 16 determines whether or not an output signal VSIG(n) from the unit pixel is smaller or larger than a predetermined value based on the level of an output signal digitalized by CDS & ADC 14. The signal level determination circuit 16 then supplies a determination output to a timing generator 17 and also to CDS & ADC 14 as an analog gain control signal.

The timing generator 17 generates, for example, an electronic shutter control signal for controlling an accumulation time for photo diodes, and a control signal for switching of an operation mode at respective predetermined timings. The timing generator 17 supplies the signals to the vertical shift register 12.

Each unit pixel has the same circuit configuration. In the present embodiment, one high-sensitivity pixel and one low-sensitivity pixel are arranged in each unit pixel. Now, the configuration of the unit pixel 1(m, n) in FIG. 1 will be described.

The unit pixel 1(m, n) comprises a first photo diode PD1 configured to photoelectrically convert incident light and in which the converted light is accumulated, a first read transistor READ1 connected to the first diode PD1 to controllably read signal charge from the first photo diode PD1, a second photo diode PD2 having a lower photosensitivity than the first photo diode PD1 configured to photoelectrically convert incident light and in which the converted light is accumulated, a second read transistor READ2 connected to the second photo diode PD2 to controllably read signal charge from the second photo diode PD2, a floating diffusion FD connected to one end of each of the first and second read transistors READ1 and READ2 and in which the signal charges read from the first and second read transistors READ1 and READ 2 are temporarily accumulated, an amplification transistor AMP including a gate connected to the floating diffusion FD to amplify a signal from the floating diffusion FD and output the amplified signal to the vertical signal line 11(n), a reset transistor RST including a source connected to a gate potential (FD potential) of the amplification transistor AMP to reset the gate potential, and a select transistor ADR configured to controllably supply a power supply voltage to the amplification transistor AMP in order to controllably select a unit pixel at a desired horizontal position in the vertical direction. In the present example, the transistors are n-type MOSFETs.

The select transistor ADR, the reset transistor RST, the first read transistor READ1, and the second read transistor READ2 are controlled by signal lines ADRES(m), RESET (m), READ1(m), and READ2(m) in the corresponding rows. Furthermore, one end of the amplification transistor AMP is connected to the vertical signal line 11(n) in the corresponding column.

FIG. 2A is a diagram schematically showing a layout image of an element formation area and a gate which correspond to a part of the imaging area of the CMOS image sensor in FIG. 1. FIG. 2B is a diagram schematically showing a layout image of color filters and micro lenses corresponding to a part of the imaging area of the CMOS image sensor in FIG. 1. A normal RGB Bayer arrangement is adopted as the arrangement of the color filters and micro lenses.

In FIG. 2A and FIG. 2B, R(1) and R(2) denote areas corresponding to R pixels. B(1) and B(2) denote areas corresponding to B pixels. Gb(1), Gb(2), Gr(1), and Gr(2) denote areas corresponding to G pixels. D denotes a drain area. To indicate correspondence relationship with the signal lines, FIG. 2A and FIG. 2B also show the mth signal lines ADRES (m), RESET(m), RED1(m), and READ2(m), the (m+1)th signal lines ADRES(m+1), RESET(m+1), RED1(m+1), and READ2(m+1), the nth vertical signal lines 11(n), and the (n+1)th vertical signal line 11(n+1).

As shown in FIG. 2A and FIG. 2B, a high-sensitivity pixel and a low-sensitivity pixel are arranged in each unit pixel. A color filter and a micro lens 20 which are large in area are arranged on each high-sensitivity pixel. A color filter and a micro lens 30 which are small in area are arranged on each high-sensitivity pixel.

FIG. 3 is a diagram showing an example of operation timings for pixels in a low-sensitivity mode suitable for the case of a large quantity of signal charge accumulated in the first and second photo diodes PD1 and PD2 in the CMOS image sensor in FIG. 1 (bright time), as well as potentials in the semiconductor substrate during a reset operation and during a read operation. If the quantity of signal charge is large, the sensitivity of the sensor needs to be reduced to minimize saturation of the sensor, thus increasing the dynamic range.

First, the reset transistor RST is turned on to perform a reset operation to set the potential of the floating diffusion FD obtained immediately after the reset operation, to the same level as that of a drain (a power source for the pixel). After the reset operation is finished, the reset transistor RST is turned off. Then, a voltage corresponding to the potential of the floating diffusion FD is output to the vertical signal line 11. The voltage value is loaded into a CDS circuit in CDS & ADC 14 (dark time level).

Then, the first read transistor READ1 or the second read transistor READ2 is turned on to transfer the signal charge already accumulated in the photo diode PD1 or PD2, to FD. In a low-sensitivity mode, a read operation is performed in which only the second read transistor READ2 is turned on to transfer only the signal charge already accumulated in the second photo diode PD2, which offers a lower sensitivity, to the floating diffusion FD. In conjunction with the transfer of the signal charge, the FD potential changes. Since the voltage corresponding to the potential of the floating diffusion FD is output to the vertical signal line 11, the voltage value is loaded into the CDS circuit (signal level). Thereafter, the CDS circuit subtracts the dark time level from the signal level to cancel noise such as a variation in Vth (threshold) of the amplification transistor AMP. Thus, pure signal components are obtained (CDS operation).

For the low-sensitivity mode, for simplification of description, the operation of the first photo diode PD1 and the first read transistor READ1 will not be described. In actuality, in order to prevent the signal charge in the first photo diode PD1 and the first read transistor READ1 from overflowing to the floating diffusion FD, the first read transistor READ1 may be turned on immediately before the operation of resetting the floating diffusion FD to discharge the signal charge accumulated in the first photo diode PD1. Furthermore, the first read transistor READ1 may be turned on at any time other than during the operation of resetting the floating diffusion FD and the operation of reading a signal from the second photo diode PD2.

Figure 4:
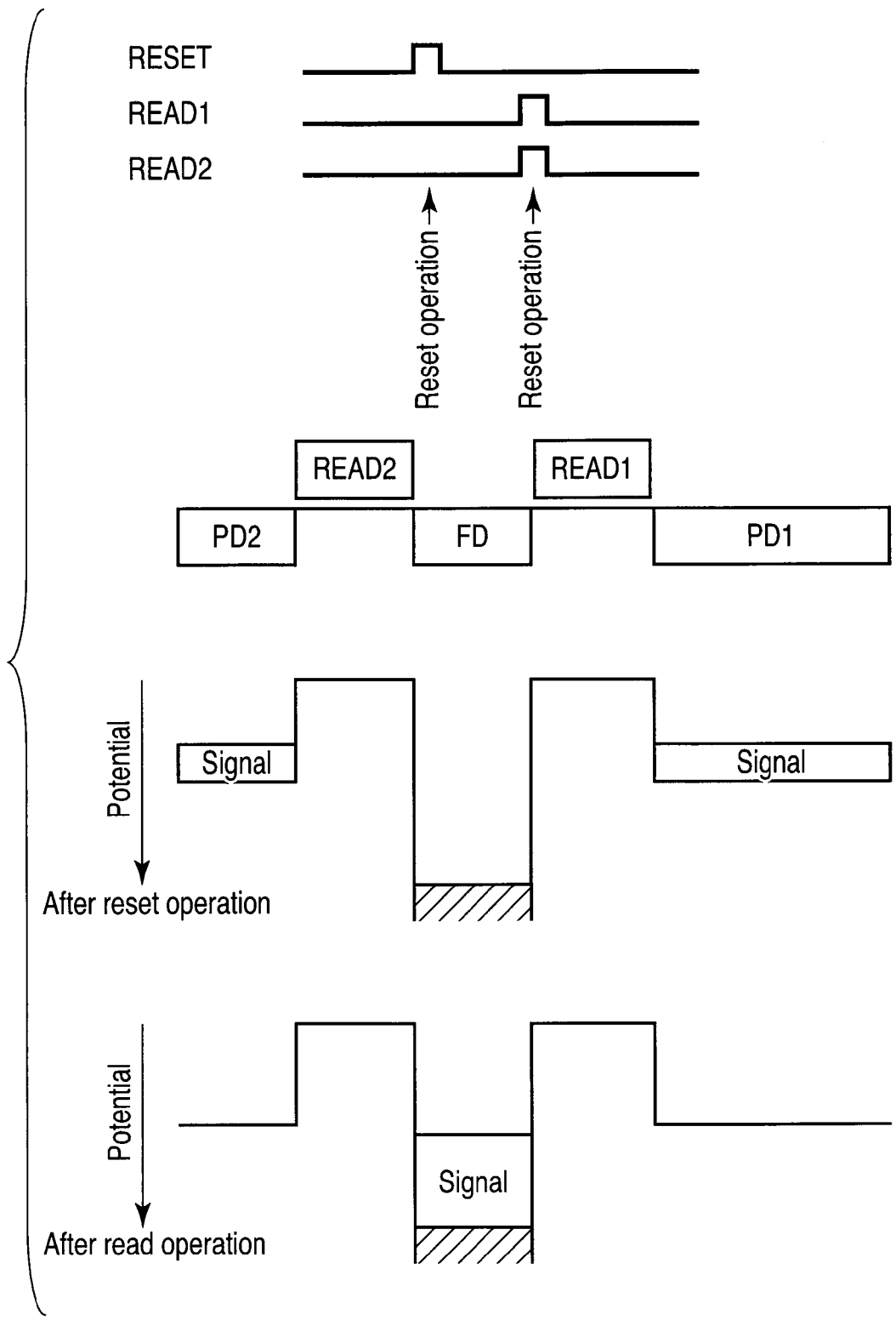
FIG. 4 is a diagram showing an example of operation timings for the pixels in the high-sensitivity mode suitable for the case of a small quantity of signal charge accumulated in the photo diodes in each unit pixel in FIG. 1 (dark time), as well as potentials in a semiconductor substrate during a reset operation and during a read operation.

On the other hand, FIG. 4 is a diagram showing an example of operation timings for the pixels in a high-sensitivity mode suitable for the case of a small quantity of signal charge accumulated in the floating diffusion FD in the CMOS image sensor in FIG. 1 (dark time), as well as potentials in the semiconductor substrate during a reset operation and during a read operation. When the quantity of signal charge in the floating diffusion FD is small, the sensitivity of the CMOS image sensor needs to be increased to improve an S/N ratio.

First, the reset transistor RST is turned on to perform a reset operation to set the potential of the floating diffusion FD obtained immediately after the reset operation, to the same level as that of the drain (the power source for the pixel). After the reset operation is finished, the reset transistor RST is turned off. Then, the voltage corresponding to the potential of the floating diffusion FD is output to the vertical signal line 11. The voltage value is loaded into the CDS circuit in CDS & ADC 14 (dark time level).

Then, the first read transistor READ1 and the second read transistor READ2 are turned on to transfer the signal charge already accumulated in the photo diodes PD1 and PD2, to the floating diffusion FD. In a high-sensitivity mode, a read operation is performed in which both the first and second read transistors READ1 and READ2 are turned on to transfer all of the signal charge acquired in the dark state to the floating diffusion FD. In conjunction with the transfer of the signal charge, the FD potential changes. Since the voltage corresponding to the potential of the floating diffusion FD is output to the vertical signal line 11, the voltage value is loaded into the CDS circuit (signal level). Thereafter, the CDS circuit subtracts the dark time level from the signal level to cancel noise such as a variation in Vth of the amplification transistor AMP. Thus, pure signal components are obtained (CDS operation).

In general, in the CMOS image sensor, thermal noise and 1/f noise which may occur in the amplification transistor AMP account for a high percentage of all the possible noise. Thus, when the signal is added to increase the signal level at the time of the transfer to the floating diffusion FD before noise is generated, the S/N ratio is advantageously increased. Furthermore, when the signal is added at the time of the transfer to the floating diffusion FD, the number of pixels is reduced to effectively allow the frame rate of the CMOS image sensor to be increased.

The embodiment is not limited to the addition of the signal charge in the floating diffusion FD. The signal charges in the first and second photo diodes PD1 and PD2 may be separately output using a pixel source follower circuit. In this case, a signal processing circuit outside the CMOS sensor may be used to carry out the weighted addition of the signal charges in the first and second photo diodes PD1 and PD2 in the ratio of, for example, 2:1 instead of the simple addition.

As described above, in the present embodiment, one high-sensitivity pixel and one low-sensitivity are provided in each of the unit pixels in the CMOS image sensor. When the quantity of signal charge is small, both the signals from the high- and low-sensitivity pixels are used. In this case, the signal charges may be added and read within the unit pixel. Furthermore, when the quantity of signal charge is large, only the signal from the low-sensitivity pixel is read. Thus, the two operation modes are used depending on the situation.

In the present embodiment, since one high-sensitivity pixel and one low-sensitivity are arranged in each unit pixel, the relationship expressed by Expression (1) is established. That is, the photosensitivity/saturation level of a conventional pixel, the photosensitivity/saturation level of the high-sensitivity pixel, and the photosensitivity/saturation level of the low-sensitivity pixel are defined as follows. Photosensitivity of the conventional pixel: SENS Saturation level of the conventional pixel: VSAT Photosensitivity of the high-sensitivity pixel: SENS1 Saturation level of the high-sensitivity pixel: VSAT1 Photosensitivity of the low-sensitivity pixel: SENS2 Saturation level of the low-sensitivity pixel: VSAT2

Then, the following relationship is established.

$$SENS=SENS1+SENS2$$

$$VSAT=VSAT1+VSAT2 \qquad \text{Expression (1)}$$

When the high-sensitivity pixel is saturated and switched to the low-sensitivity mode, the quantity of signal charge obtained decreases to reduce S/N. The quantity of light at which the high-sensitivity pixel is saturated is expressed as VSAT1/SENS1. The signal output from the low-sensitivity at this quantity of light is expressed as VSAT1×SENS2/SENS1. Thus, the rate of decrease in signal output at this quantity of light is expressed as follows.

$$(VSAT1 \times SENS2/SENS1)/(VSAT1 \times SENS/SENS1)$$
$$=SENS2/SENS \qquad \text{Expression (2)}$$

To avoid a decrease in signal output at the time of the switching between the high-sensitivity mode and the low-sensitivity mode, it is proper to set SENS2/SENS to between 10% and 50%. In the present embodiment, SENS2/SENS=¼=25% is set.

On the other hand, the effect for increasing the dynamic range can be expressed based on the maximum incident light quantity in the low-sensitivity mode VSAT2/SENS2 and the maximum incident light quantity (dynamic range) of the conventional pixel VSAT/SENS as follows.

$$(VSAT2/VSAT) \times (SENS/SENS2) \qquad \text{Expression (3)}$$

Expression (3) clearly indicates that VSAT2/VSAT is as high as possible. This means that the saturation level of the low-sensitivity pixel is equivalent to or higher than that of the high-sensitivity pixel. When the following expression is satisfied, the dynamic range can be increased.

$$VSAT1/SENS1 < VSAT2/SENS2 \qquad \text{Expression (4)}$$

Figure 5:
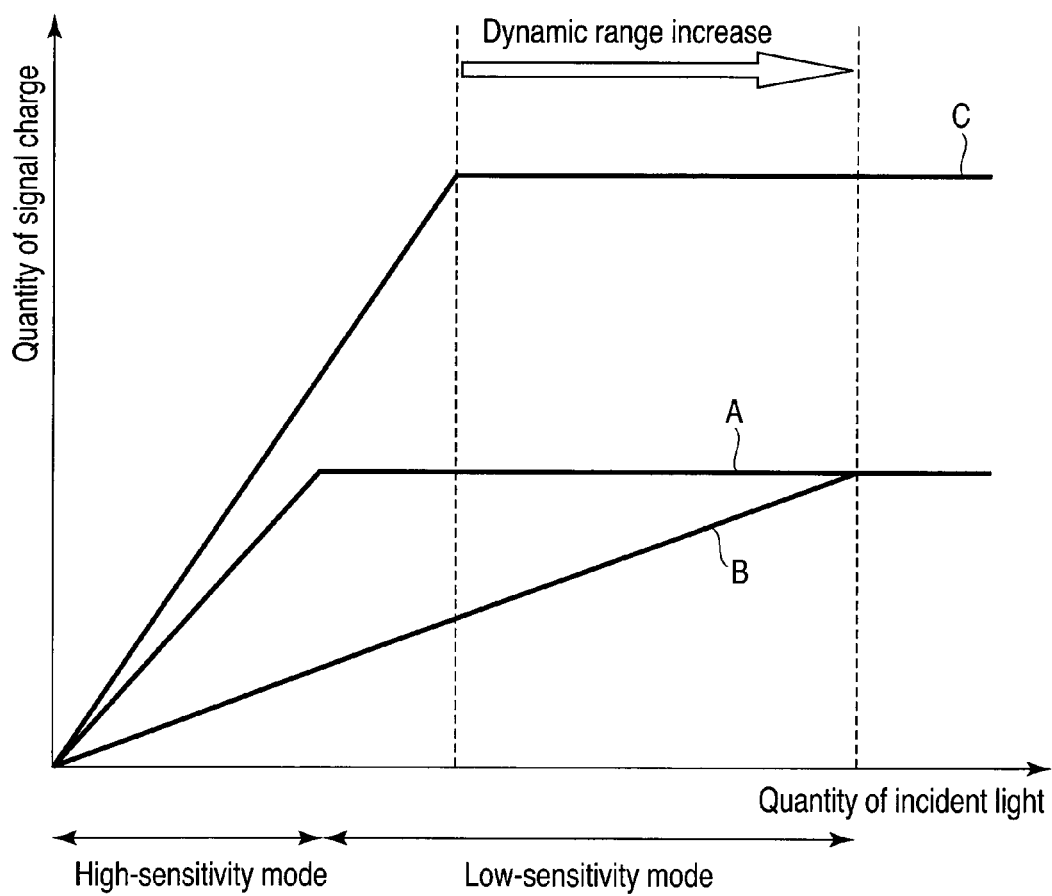
FIG. 5 is a diagram showing an example of characteristics illustrating the dynamic range increase effect of the CMOS image sensor according to the first embodiment.

FIG. 5 is a diagram showing an example of characteristics illustrating the dynamic range increase effect of the CMOS image sensor according to the first embodiment. In FIG. 5, the axis of abscissas indicates the quantity of incident light. The axis of ordinate indicates the quantity of signal charge generated in the photo diode. FIG. 5 shows the characteristic A of the high-sensitivity pixel (PD1), the characteristic B of the low-sensitivity pixel (PD2), and the characteristic C of a pixel (conventional pixel) in a conventional unit pixel.

In the present embodiment, the photosensitivity of the high-sensitivity pixel (PD1) is set equal to three-fourths of that of the conventional pixel. The photosensitivity of the low-sensitivity pixel (PD2) is set equal to a quarter of that of the conventional pixel. Furthermore, the saturation level of the high-sensitivity pixel (PD1) is set equal to half of that of the conventional pixel. The saturation level of the low-sensitivity pixel (PD2) is set equal to half of that of the conventional pixel.

As seen in FIG. 5, the photosensitivity of the high-sensitivity pixel (PD1) is set equal to three-fourths of that of the conventional pixel, and the photosensitivity of the low-sensitivity pixel (PD2) is set equal to a quarter of that of the conventional pixel. Thus, in a high-sensitivity mode in which the outputs from the high-sensitivity pixel (PD1) and the low-sensitivity pixel (PD2) are added together, the quantity of signal charge is equivalent to that in the conventional pixel.

On the other hand, the saturation level of the low-sensitivity pixel (PD2) is half of that of the conventional pixel, and the photosensitivity of the low-sensitivity pixel (PD2) is a quarter of that of the conventional pixel. As a result, the range of saturation within which the low-sensitivity pixel (PD2) operates without being saturated is about twice as large as the range of saturation of the conventional pixel. That is, the dynamic range in the low-sensitivity mode, in which the output from the low-sensitivity pixel (PD2) is used, is twice as large as that of the conventional pixel.

As described above, the CMOS image sensor according to the present embodiment effectively enables the dynamic range to be increased by utilizing the low-sensitivity mode. The CMOS image sensor according to the present embodiment also effectively enables a decrease in photosensitivity to be reduced if the quantity of light is small (if it is dark). That is, the CMOS image sensor according to the present embodiment allows the tradeoff (paradoxical) relationship between the photosensitivity and the quantity of signal charge handled to be overcome to enable the quantity of signal charge to be increased with low noise during the dark time maintained.

Moreover, in the present embodiment, the CMOS image sensor is used to increase the dynamic range. Thus, the advantages of the CMOS sensor, that is, a decimation operation and the like, can be utilized to design a high-speed sensor with a high frame rate.

In the CMOS image sensor according to the present embodiment, each of the first photo diode PD1 and the second photo diode PD2 has an RGB Bayer arrangement, which is commonly used. Thus, both in the high-sensitivity mode and in the low-sensitivity mode, the output signal corresponds to the Bayer arrangement. Therefore, conventional color signal processing such as demosaicing can be utilized without any change.

Furthermore, in the CMOS image sensor according to the present embodiment, the first and second photo diodes PD1 and PD2 are arranged checkerwise. Thus, the components in the pixel can be easily laid out as follows. As shown in FIG. 2, the floating diffusion FD is placed between the first photo diode PD1 and the second photo diode PD2. Moreover, the transistors AMP and RST are arranged in the remaining gap.

2. Example of a Sectional Configuration

Now, an example of a sectional configuration of the solid-state imaging device according to the first embodiment will be described with reference to FIG. 6 and FIG. 7. Here, by way of example, a section taken along line VII-VII in FIG. 2B as seen from the direction of an arrow will be described.

In the description below, electrons are accumulated in the photo diode. However, even if holes are accumulated in the photo diode, similar effects can be exerted by forming an isolation layer using an n-type semiconductor.

2-1.

Figure 6:
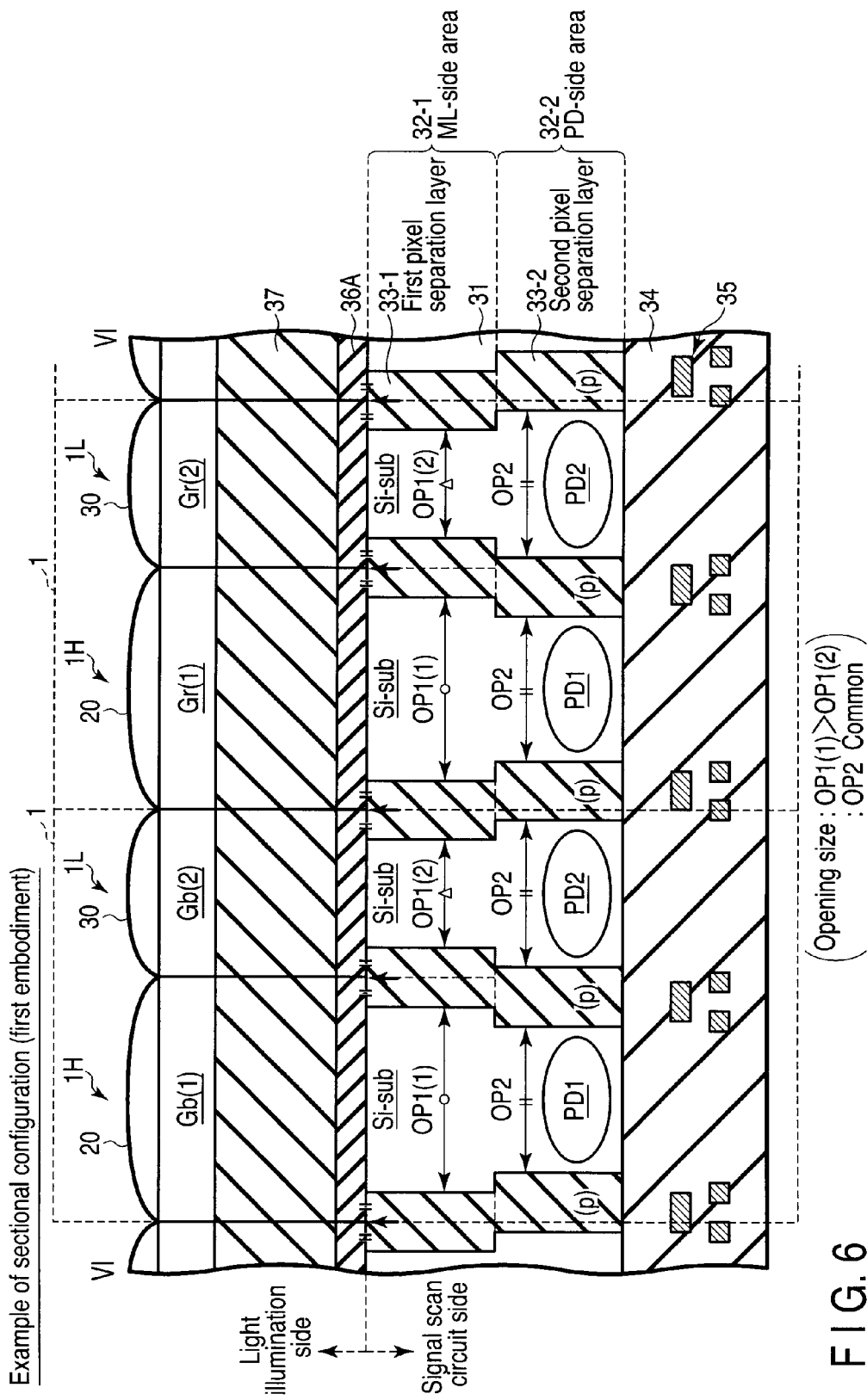
FIG. 6 is a sectional view taken along line VII-VII in FIG. 2B as seen from the direction of an arrow.

As shown in FIG. 6, the unit pixel 1 comprises a high-sensitivity pixel 1H and a low-sensitivity pixel 1L with a lower sensitivity than the high-sensitivity pixels 1H; high-sensitivity pixels 1H and low-sensitivity pixels 1L are arranged checkerwise on a semiconductor substrate 31. The semiconductor substrate 31 is an n-type semiconductor layer formed epitaxially grown on an SOI (Silicon On Insulator) substrate.

In each pixel, the high-sensitivity pixel 1H and the low-sensitivity pixel 1L are separate from each other by a first pixel separation layer 33-1 and a second pixel separation later 33-2 in the semiconductor substrate 31. Each of the high-sensitivity pixel 1H and the low-sensitivity pixel 1L comprises a signal scan circuit section and a photoelectric conversion section.

The first and second pixel separation layers 33-1 and 33-2 are formed by implanting p-type impurities, for example, B (boron), which are doped into the semiconductor substrate 31.

The first pixel separation layer 33-1 is located in an ML-side area 32-1 corresponding to a light illumination surface side in the semiconductor substrate 31. Furthermore, an opening OP1(1) between the first pixel separation layers 33-1 in the high-sensitivity pixel 1H is larger than an opening OP1(2) between the first pixel separation layers 33-1 in the low-sensitivity pixel 1L (OP1(1)>OP(2)). Moreover, the combination of the opening OP1(1) between the first pixel separation layers 33-1 in the high-sensitivity pixel 1H and the opening OP1(2) between the first pixel separation layers 33-1 in the low-sensitivity pixel 1L are common to all the pairs of the high-sensitivity pixel 1H and the low-sensitivity pixel 1L (substantially the same for all the pairs of the high-sensitivity pixel 1H and the low-sensitivity pixel 1L). Furthermore, in the present example, the pixel center position of the first pixel separation layer 33-1 is located so as to coincide with the lens end of each of the micro lenses 20 and 30 in the high-sensitivity pixel 1H and the low-sensitivity pixel 1L, respectively.

The second pixel separation layer 33-2 is provided in a PD-side area 32-2 closer to the signal scan circuit in the semiconductor substrate 31 so as to surround the photo diodes PD1 and PD2. The second pixel separation layer 33-2 is located continuously with the first pixel separation layer 33-1. The opening OP2 between the second pixel separation layers 33-2 is common to the high-sensitivity pixel 1H and the low-sensitivity pixel 1L (substantially the same for both the high-sensitivity pixel 1H and the low-sensitivity pixel 1L).

The signal scan circuit section is formed of, for example, the amplification transistor (not shown in the drawings) formed in an interlayer insulation film 34 provided on the signal scan circuit side of the semiconductor substrate 31, and a wiring layer 35. The wiring layer 35 is formed of, for example, AL (aluminum) or Cu (copper).

The photoelectric conversion section comprises the photo diodes PD1 and PD2, a light illumination-side protect film 36A, a flattened layer 37, color filters (GB(1), Gb(2), Gr(1), and Gr(2)), and the first and second micro lenses 20 and 30.

The photo diodes PD1 and PD2 are provided in the semiconductor substrate 31 to carry out photoelectric conversion and to store charge.

The light illumination-side protect film 36A is formed of a silicon oxide film, a silicon nitride film, or the like and provided on the light illumination side of the semiconductor substrate 31.

The flattened layer is provided on the protect film 36A and formed of, for example, resin.

The color filters (Gb(1), Gb(2), Gr(1), and Gr(2)) are arranged on the flattened layer 37.

Each of the first and second micro lenses 20 and 30 is located on one of the color filers (Gb(1), Gb(2), Gr(1), and Gr(2)) to focus light on the photo diodes PD1 and PD. The first micro lens 20 is larger than the second micro lens 30 in area. The first micro lens 20 and the second micro lens 30 are arranged checkerwise.

2-2. Incident Light During Imaging

Now, light incident on the sectional configuration shown in FIG. 6 during imaging will be described with reference to FIG. 7.

In the configuration shown in FIG. 6, the opening OP1(1) between the first pixel separation layers 33-1 in the high-sensitivity pixel 1H is larger than the opening OP1(2) between the first pixel separation layers 33-1 in the low-sensitivity pixel 1L (OP1(1)>OP1(2)). Moreover, the combination of the opening OP1(1) between the first pixel separation layers 33-1 in the high-sensitivity pixel 1H and the opening OP1(2) between the first pixel separation layers 33-1 in the low-sensitivity pixel 1L is common to all the pairs of the high-sensitivity pixel 1H and the low-sensitivity pixel 1L (substantially the same for all the pairs of the high-sensitivity pixel 1H and the low-sensitivity pixel 1L). Furthermore, in the present example, the pixel center position of the first pixel separation layer 33-1 is located so as to coincide with the lens end of each of the micro lenses 20 and 30 in the high-sensitivity pixel 1H and the low-sensitivity pixel 1L, respectively.

Thus, as shown in FIG. 7, light L(1) incident through the high-sensitivity pixel 1H can be prevented from entering the first pixel separation layer 33-1, which separates the photo diode D2 in the adjacent low-sensitivity pixel 1L from the high-sensitivity pixel 1H. Thus, the first pixel separation layer 33-1 enables a reduction in carriers resulting from photoelectric conversion. Furthermore, compared to a comparative example described below, the structure of the first pixel separation layer 33-1 allows the light L(1) incident through the high-sensitivity pixel 1H to be prevented from entering the adjacent low-sensitivity pixel 1L. That is, the present embodiment has the advantage of allowing inflow of carriers generated to be prevented, while enabling a reduction in optical crosstalk.

On the other hand, the opening OP2 between the second pixel separation layers 33-2 is common to the high-sensitivity pixel 1H and the low-sensitivity pixel 1L (substantially the same for both the high-sensitivity pixel 1H and the low-sensitivity pixel 1L).

Thus, the present embodiment has the advantage of making the quantity of saturated electrons (potential) common to the photo diodes PD1 and PD2.

3. Manufacturing Method

Now, a method for manufacturing a solid-state imaging device according to the first embodiment will be described with reference to FIG. 8 to FIG. 13. The configuration shown in FIG. 6 will be described by way of example.

Figure 8:
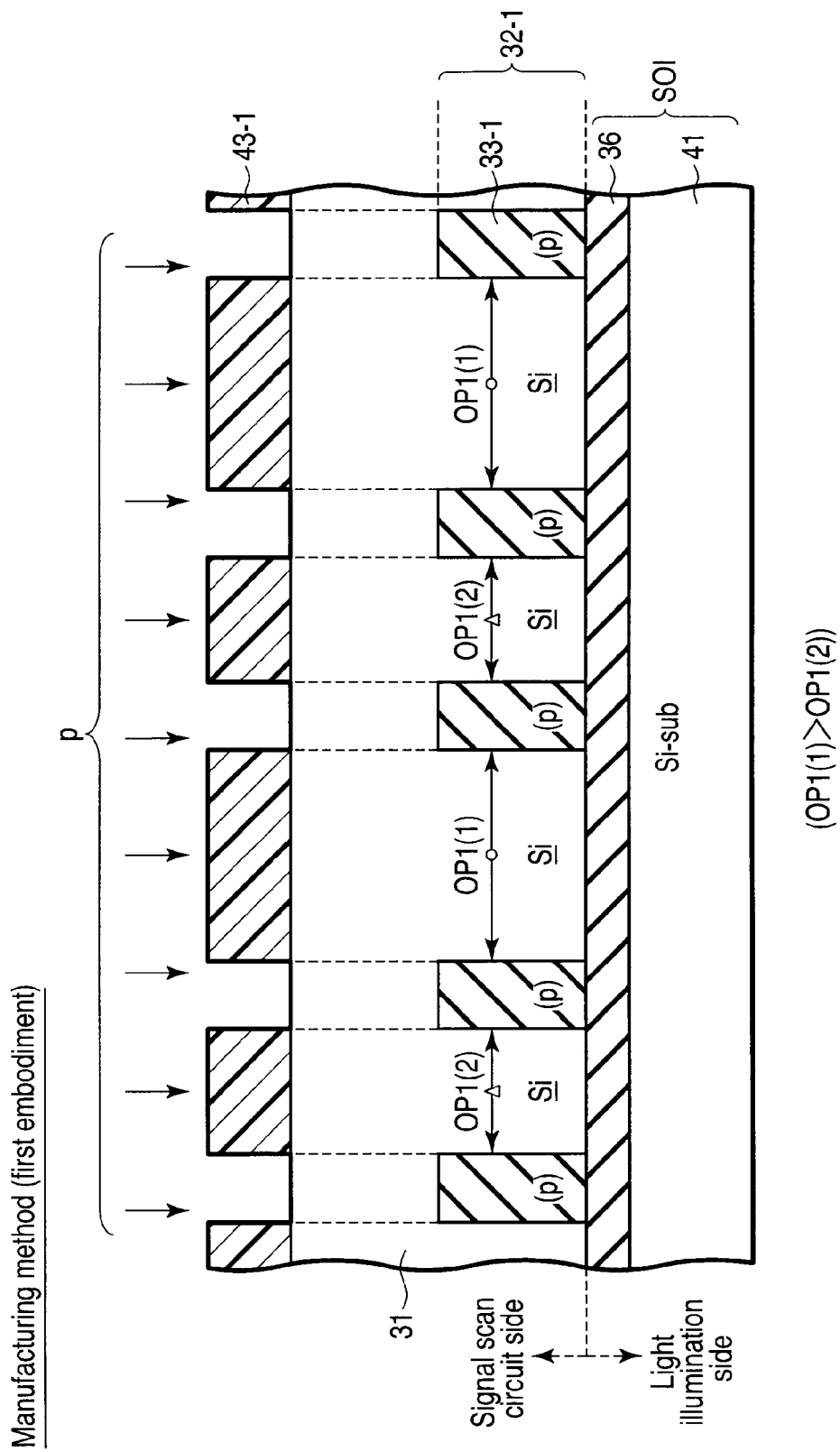
FIG. 8 is a sectional view showing a step of manufacturing a solid-state imaging device according to the first embodiment.

As shown in FIG. 8, in this example, an SOI (Silicon On Insulator) substrate comprising a silicon substrate 41 and an oxide film 36 is used by way of example. First, a semiconductor substrate 31 is formed by epitaxially growing an n-type semiconductor layer on a signal scan circuit side of the SOI substrate to a thickness of, for example, about 1.0 to 5.0 μm.

Subsequently, a photo resist 43-1 is applied onto the surface of the signal scan circuit side of the semiconductor substrate 31. The photo resist 43-1 is subjected to exposure and development to expose the surface of the semiconductor substrate 31 so that the opening OP1(1) between the first pixel separation layers 33-1 in the high-sensitivity pixel 1H is larger than the opening OP1(1) between the first pixel separation layers 33-1 in the low-sensitivity pixel 1H (OP1(1)>OP1(2)).

Subsequently, a first pixel separation layer 33-1 is formed as follows. An ion implantation method or the like is carried out using the photo resist 43-1 as a mask to implant p-type impurities, for example, B (boron), into the vicinity of an interface (ML-side area 32-1) on a light illumination side of the semiconductor substrate 31. A thermal process is then carried out to activate the p-type impurities. During this step, the first pixel separation layer 33-1 may be formed by carrying out the ion implantation step a plural number of times in which ions are implanted into the ML-side area 32-1 using the photo resist 43-1 as a mask. Thereafter, the photo resist 43-1 is removed.

Figure 9:
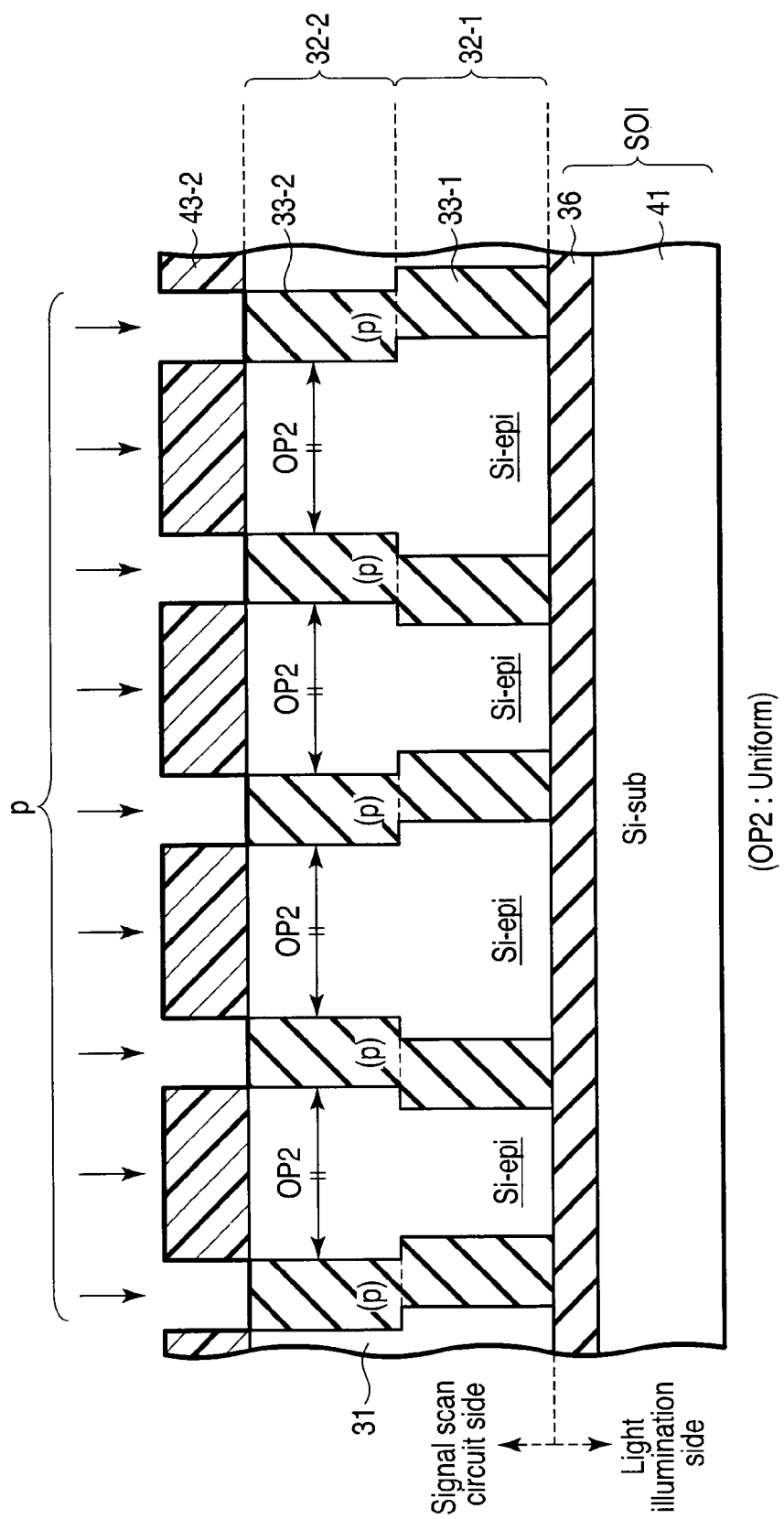
FIG. 9 is a sectional view showing a step of manufacturing a solid-state imaging device according to the first embodiment.

Subsequently, as shown in FIG. 9, a photo resist 43-2 is applied onto the surface of the signal scan circuit side of the semiconductor substrate 31. Then, the photo resist 43-2 is subjected to exposure and development to expose the surface of the semiconductor substrate 31 so that the opening OP2 between the second pixel separation layers 33-2 is common to the high-sensitivity pixel 1H and the low-sensitivity 1L (substantially the same for both the high-sensitivity pixel 1H and the low-sensitivity pixel 1L).

Subsequently, a second pixel separation layer 33-2 is formed as follows. The ion implantation method or the like is carried out using the photo resist 43-2 as a mask to implant p-type impurities, for example, B (boron), into the vicinity of an interface (PD-side area 32-2) on the signal scan circuit side of the semiconductor substrate 31. The second pixel separation layer 33-2 is formed so as to surround a photo diode subsequently formed. The thermal process is then carried out to activate the p-type impurities. During this step, the second pixel separation layer 33-2 may be formed by carrying out the ion implantation step a plural number of times as described above. Thereafter, the photo resist 43-2 is removed.

Figure 10:
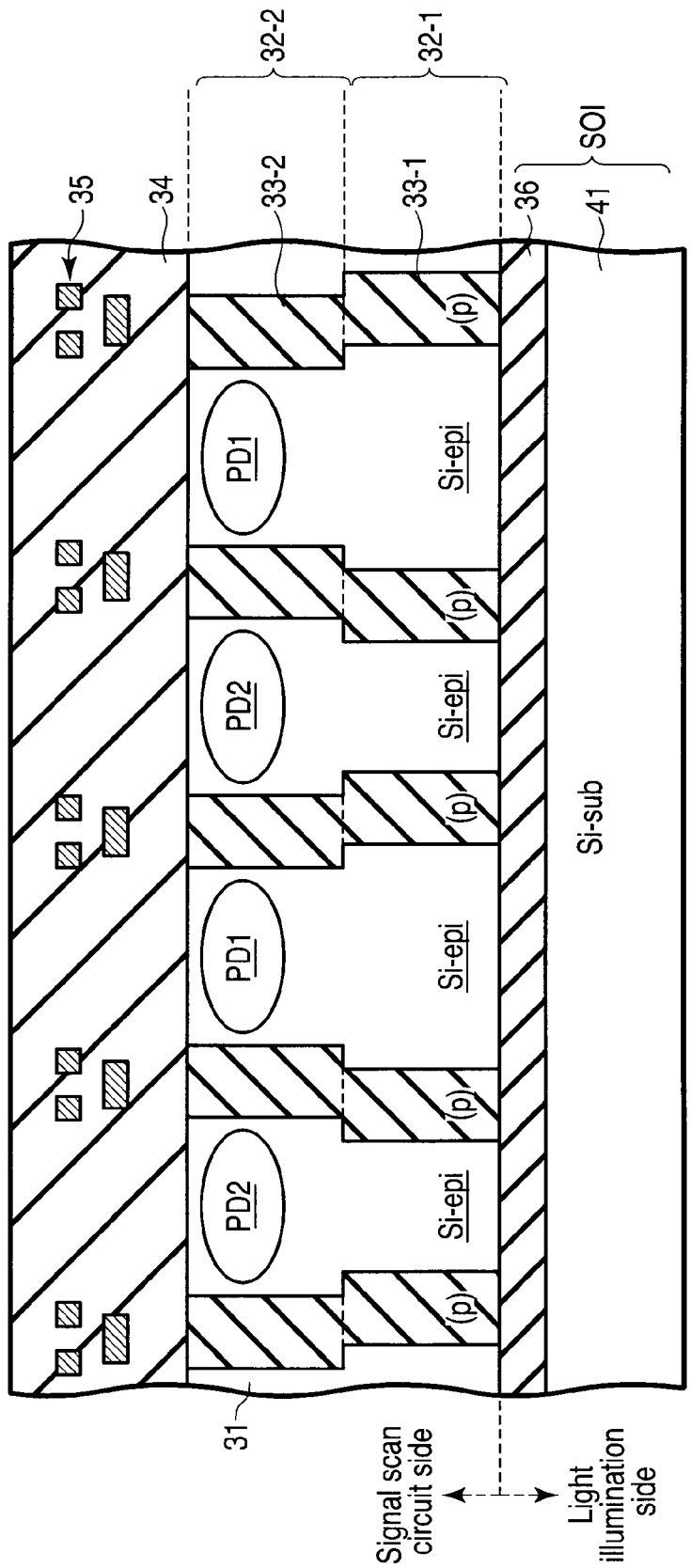
FIG. 10 is a sectional view showing a step of manufacturing a solid-state imaging device according to the first embodiment.

Subsequently, as shown in FIG. 10, photo diodes PD1 and PD2 are formed in the high-sensitivity pixel and the low-sensitivity pixel, respectively, in the vicinity of the interface (PD-side area 32-2) on the signal scan circuit side of the semiconductor substrate 31 so that each diode is enclosed by the second pixel separation layers 33-2.

Subsequently, an interlayer insulation film 34 is formed on the surface of the signal scan circuit side of the semiconductor substrate 31. Then, a wiring layer 35 is formed in the interlayer insulation film 34 using AL (aluminum), Cu (copper), or the like.

Figure 11:
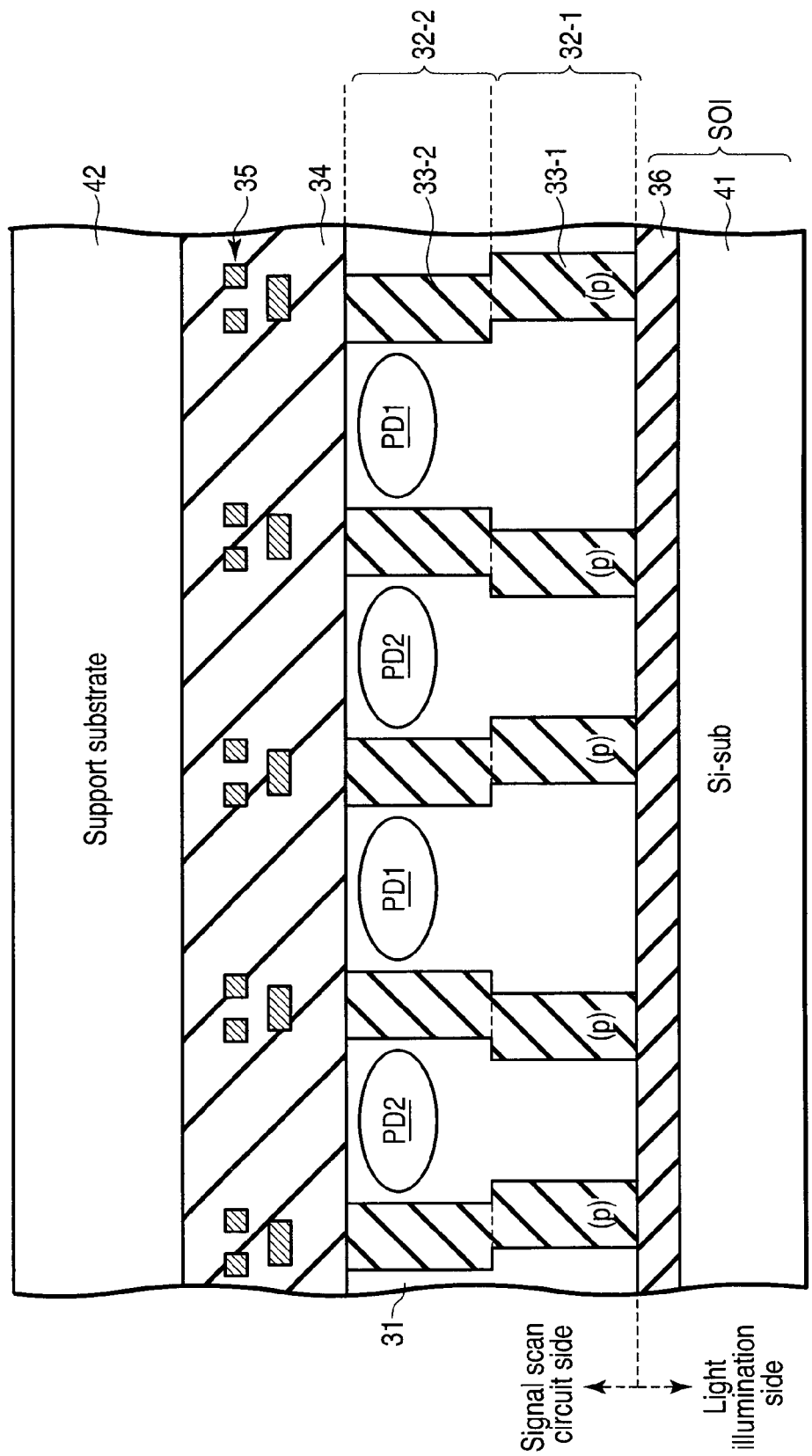
FIG. 11 is a sectional view showing a step of manufacturing a solid-state imaging device according to the first embodiment.

Then, as shown in FIG. 11, a support substrate 42 formed of silicon or the like is laminated onto the interlayer insulation film 34 using, for example, an adhesive or a direct junction method.

Subsequently, as shown in FIG. 12, the SOI substrate is turned upside down. The light illumination-side surface of the SOI substrate is then subjected to, for example, polishing based on a CMP (Chemical Mechanical Polishing) method, or an etching method to remove the substrate 41 to the oxide film 36. The light illumination-side surface of the semiconductor substrate 31 is thus exposed.

Then, a silicon oxide film or a silicon nitride film is formed on the exposed light illumination side of the semiconductor substrate as a protect film 36A.

Figure 13:
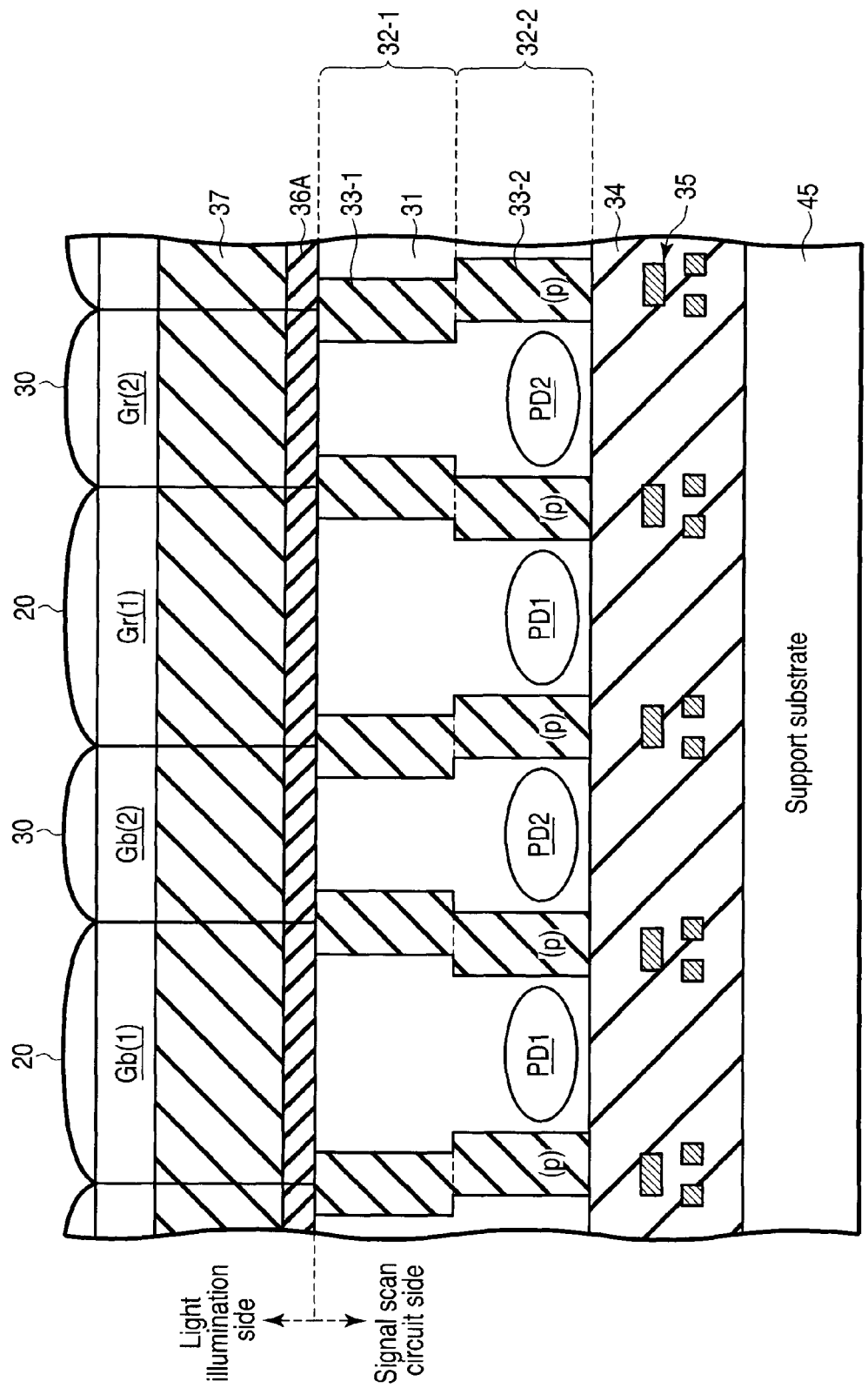
FIG. 13 is a sectional view showing a step of manufacturing a solid-state imaging device according to the first embodiment.

Subsequently, as shown in FIG. 13, well known steps are used for sequentially form a flattened layer 37, color filters (Gb(1), Gb(2), Gr(1), and Gr(2)), and the first and second micro lenses 20 and 30. Thus, the solid-state imaging device shown in FIG. 6 is manufactured.

In the description of the present manufacturing method, the SOI substrate is used. However, the embodiment is not limited to this. The semiconductor substrate may be a semiconductor area. Thus, even if a silicon bulk substrate is used instead of the SOI substrate so as to be controllably polished or etched, the above-described isolation method can be carried out.

4. Operations and Effects

The solid-state imaging device, the operation of the solid-state imaging device, and the manufacturing method for the solid-state imaging device according to the first embodiment serve to exert effects (1) and (2) described below.

(1) Light Incident Through the High-Sensitivity Pixel can be Prevented from Entering the Adjacent Low-Sensitivity Pixel, Reducing Crosstalk.

As described above, in the configuration according to the first embodiment, the opening OP1(1) between the first pixel separation layers 33-1 in the high-sensitivity pixel 1H is larger than the opening OP1(2) between the first pixel separation layers 33-1 in the low-sensitivity pixel 1L (OP1(1) >OP1(2)). Moreover, the combination of the opening OP1(1) between the first pixel separation layers 33-1 in the high-sensitivity pixel 1H and the opening OP1(2) between the first pixel separation layers 33-1 in the low-sensitivity pixel 1L is common to all the pairs of the high-sensitivity pixel 1H and the low-sensitivity 1L (substantially the same for all the pairs of the high-sensitivity pixel 1H and the low-sensitivity pixel 1L). Furthermore, in the present example, the pixel center position of the first pixel separation layer 33-1 is located so as to coincide with the lens end of each of the micro lenses 20 and 30 in the high-sensitivity pixel 1H and the low-sensitivity pixel 1L, respectively.

Thus, as shown in FIG. 7, light L(1) incident through the high-sensitivity pixel 1H can be prevented from entering the first pixel separation layer 33-1, which separates the photo diode D2 in the adjacent low-sensitivity pixel 1L from the high-sensitivity pixel 1H. Thus, the first pixel separation layer 33-1 enables a reduction in carriers resulting from photoelectric conversion. Furthermore, compared to the comparative example described below, the structure of the first pixel separation layer 33-1 allows the light L(1) incident through the high-sensitivity pixel 1H to be prevented from entering the adjacent low-sensitivity pixel 1L. That is, the present embodiment has the advantage of allowing inflow of carriers generated to be prevented, while enabling a reduction in optical crosstalk.

(2) The Quantity of Saturated Electrons (Potential) can be Made Common to the Photo Diodes.

In addition, the opening OP2 between the second pixel separation layers 33-2 is common to the high-sensitivity pixel 1H and the low-sensitivity pixel 1L (substantially the same for both the high-sensitivity pixel 1H and the low-sensitivity pixel 1L).

Thus, advantageously, the quantity of saturated electrons (potential) can be made common to the photo diodes PD1 and PD2.

Second Embodiment

An Example in which a Plurality of Pixel Separation Layers are Provided

Now, a solid-state imaging device and a manufacturing method for the solid-state imaging device according to a second embodiment will be described with reference to FIG. 14. The second embodiment relates to an example in which a plurality of first pixel separation layers 33-1 are provided. In the description below, the same contents as those of the first embodiment will not be described in detail.

<Example of a Configuration>

As shown in FIG. 14, the solid-state imaging device according to the present example is different from the first embodiment in that as a plurality of first pixel separation layers arranged in an ML-side area 32-1, two first pixel separation layers 33-1A and 33-B are provided.

An opening OP1(1)A between the first pixel separation layers 33-1A in a high-sensitivity pixel 1H is larger than an opening OP1(2)A between the first pixel separation layers 33-1A in a low-sensitivity pixel 1L (OP1(1)A>OP1(2)A). Moreover, the combination of the opening OP1(1)A between the first pixel separation layers 33-1A in the high-sensitivity pixel 1H and the opening OP1(2)A between the first pixel separation layers 33-1A in the low-sensitivity pixel 1L is common to all the pairs of the high-sensitivity pixel 1H and the low-sensitivity pixel 1L (substantially the same for all the pairs of the high-sensitivity pixel 1H and the low-sensitivity 1L).

An opening OP1(1)B between the first pixel separation layers 33-1B in the high-sensitivity pixel 1H is larger than an opening OP1(2)B between the first pixel separation layers 33-1B in the low-sensitivity pixel 1L (OP1(1)B>OP1(2)B). Moreover, the combination of the opening OP1(1)B between the first pixel separation layers 33-1B in the high-sensitivity pixel 1H and the opening OP1(2)B between the first pixel separation layers 33-1B in the low-sensitivity pixel 1L is common to all the pairs of the high-sensitivity pixel 1H and the low-sensitivity pixel 1L (substantially the same for all the pairs of the high-sensitivity pixel 1H and the low-sensitivity 1L).

Thus, the solid-state imaging device according to the second embodiment enables a reduction in crosstalk and allows a possible decrease in isolation intensity to be prevented.

<Manufacturing Method>

A manufacturing method according to the present example is different from the first embodiment in that manufacturing steps similar to those described above are used to carry out the step of forming a first pixel separation layer a plural number of times (in the present example, twice). The other manufacturing steps are substantially similar to those of the first embodiment and will not be described in detail.

<Operations and Effects>

As described above, the solid-state imaging device, the operation of the solid-state imaging device, and the manufacturing method for the solid-state imaging device according to the second embodiment serve to exert at least effects similar to the above-described effects (1) and (2).

Moreover, in the solid-state imaging device according to the present example, as a plurality of first pixel separation layers arranged in the ML-side area 32-1, the two first pixel separation layers 33-1A and 33-1B are provided.

Thus, the solid-state imaging device according to the second embodiment enables a reduction in crosstalk and allows a possible decrease in isolation intensity to be prevented.

Comparative Example

Now, with reference to FIG. 15, a solid-state imaging device according to the comparative example will be described for comparison with the solid-state imaging devices according to the first and second embodiments.

As shown in FIG. 15, in the solid-state imaging device according to the comparative example, a pixel separation layer 133 has a similar configuration for both a high-sensitivity pixel and a low-sensitivity pixel.

Here, in back side illumination type solid-state imaging device comprising high- and low-sensitivity pixels with different sensitivities, a color filter Gb(1) and a micro lens 120 which are large in area are arranged on the high-sensitivity pixel. Moreover, an opening in the pixel separation layer 133 is the same for both the high-sensitivity pixel and the low-sensitivity pixel. Furthermore, in the comparative example, the pixel center position of the pixel separation layer 133 fails to coincide with the lens end of each of the micro lens 120 and 130 on the high-sensitivity pixel 1H and the low-sensitivity pixel 1L, respectively.

Thus, light L(1) incident through the high-sensitivity pixel enters the pixel separation layer 133 in the adjacent low-sensitivity pixel. Carriers are photoelectrically converted by the pixel separation layer 133. As a result of a small field gradient in the diffusion layer itself, the carriers migrate to the adjacent low-sensitivity pixel. This results in carrier crosstalk. Hence, the opening in the pixel separation layer 133 is the same for both the high-sensitivity pixel 1H and the low-sensitivity pixel 1L. Consequently, the opening position is not the same for both the high-sensitivity pixel and the low-sensitivity pixel, and the light L(1) incident through the high-sensitivity pixel is likely to enter the pixel separation layer in the low-sensitivity pixel.

As described above, in the configuration and the manufacturing method for the configuration according to the comparative example, the light L(1) incident through the high-sensitivity pixel cannot be prevented from entering the pixel separation layer 133, which separates the photo diode PD2 in the adjacent low-sensitivity pixel from the high-sensitivity pixel, as well as the low-sensitivity pixel. Thus, disadvantageously, not only carrier crosstalk but also optical crosstalk may occur.

<Aspects Included in the Present Example>

Furthermore, the above-described embodiments may include the following aspects.

[1] A solid-state imaging device comprising a array area for a unit pixel comprising a first photo diode configured to photoelectrically convert incident light and in which the converted light is accumulated, a first read transistor connected to the first photo diode to read signal charge from the first photo diode, a second photo diode configured to have a lower photosensitivity than the first photo diode and to photoelectrically convert the incident light and in which the converted light is accumulated, a second read transistor connected to the second photo diode to read signal charge from the second photo diode, a floating diffusion connected to the first read transistor and the second read transistor and in which the signal charge is accumulated, a reset transistor configured to reset a potential of the floating diffusion, and an amplification transistor configured to amplify the potential of the floating diffusion, the solid-state imaging device having a first operation mode in which a potential obtained by the floating diffusion by adding the signal charge in the first photo diode and the signal charge in the second photo diode together is amplified and in which a resultant signal is output, and a second operation mode in which the potential of the floating diffusion into which the signal charge in the second photo diode is read by the second read transistor is amplified and in which a resultant signal is output.

[2] A solid-state imaging device comprising a array area for a unit pixel comprising a first photo diode configured to photoelectrically convert incident light and in which the converted light is accumulated, a first read transistor connected to the first photo diode to read signal charge from the first photo diode, a second photo diode configured to have a lower photosensitivity than the first photo diode and to photoelectrically convert the incident light and in which the converted light is accumulated, a second read transistor connected to the second photo diode to read signal charge from the second photo diode, a floating diffusion connected to the first read transistor and the second read transistor and in which the signal charge is accumulated, a reset transistor configured to reset a potential of the floating diffusion, and an amplification transistor configured to amplify the potential of the floating diffusion, the solid-state imaging device having a first operation mode in which the signal charge in the first photo diode and the signal charge in the second photo diode are separately read and in which resultant signals are output, and a second operation mode in which the signal charge in the second photo diode is read and in which a resultant signal is output.

[3] In the solid-state imaging device in [1] or [2], when the photosensitivity of the first photo diode is defined as SENS1, a saturation level of the first photo diode is defined as VSAT1, the photosensitivity of the second photo diode is defined as SENS2, and a saturation level of the second photo diode is defined as VSAT2, a relational expression:

$$VSAT1/SENS1 < VSAT2/SENS2$$

is satisfied.

[4] In the solid-state imaging device in any one of [1] to [3], further comprising a first micro lens configured to focus light on the first photo diode and a second micro lens configured to focus light on the second photo diode, wherein the first micro lens is larger than the first micro lens in area, and the first micro lens and the second micro lens are arranged checkerwise.

[5] In the solid-state imaging device in any one of [1] to [3], further comprising a first micro lens configured to focus light on the first photo diode and a second micro lens configured to focus light on the second photo diode, wherein the first micro lens comprises a plurality of micro lenses, and the plurality of micro lenses as a whole are larger than the second micro lens in area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A back side illumination type solid-state imaging device comprising an imaging area in which a plurality of unit pixels each including a photoelectric conversion section and a signal scan circuit section are arranged on a semiconductor substrate, and a light illumination surface formed on a surface of the semiconductor substrate located opposite a surface of the semiconductor substrate on which the signal scan circuit section is formed, wherein the unit pixel comprises a high-sensitivity pixel and a low-sensitivity pixel with a lower sensitivity than the high-sensitivity pixel, each of the high-sensitivity pixel and the low-sensitivity element comprises a first pixel separation layer located on a light illumination surface side in the semiconductor substrate to separate the pixels from each other and a photodiode, and further comprises a first micro lens and a second micro lens both configured to focus light on the photo diode, the first micro lens being larger than the second micro lens in area, and on the light illumination side of the semiconductor substrate, an opening between the first pixel separation layers in the high-sensitivity pixel is larger than an opening between the first pixel separation layers in the low-sensitivity pixel.

2. The device of claim 1, wherein
each of the high-sensitivity pixel and the low sensitivity pixel is provided so as to surround the photo diode and further comprises a second pixel separation layer located on the signal scan circuit side in the semiconductor substrate so as to continue with the first pixel separation layer.

3. The device of claim 2, wherein the second pixel separation layer has a width common to both the high-sensitivity pixel and the low-sensitivity pixel.

4. The device of claim 1, wherein a plurality of the first pixel separation layers are further arranged on the light illumination surface side in the semiconductor substrate.

5. The device of claim 4, wherein the opening between the plurality of first pixel separation layers in the high-sensitivity pixel is larger than the opening between the plurality of first pixel separation layers in the low-sensitivity pixel.

6. The device of claim 1, wherein the first micro lens and the second micro lens have a planar shape in which first micro lens and the second micro lens are arranged checkerwise.

7. The device of claim 1, wherein a pixel center position of the first pixel separation layer is located so as to coincide with a lens end of each of the first and second micro lenses.

8. A method of manufacturing a back side illumination type solid-state imaging device comprising:

forming a first pixel separation layer on a light illumination side of a semiconductor substrate in such a manner that an opening in a high-sensitivity pixel is larger than an opening in a low-sensitivity pixel;

forming a second pixel separation layer located in the semiconductor substrate so as to continue with the first pixel separation layer and in such a manner that an opening in the second pixel separation layer is common to both a high-sensitivity pixel and a low-sensitivity pixel;

forming a photo diode in each of the high-sensitivity pixel and the low-sensitivity pixel on a signal scan circuit side of the semiconductor substrate;

forming a signal scan circuit on the signal scan circuit side of the semiconductor substrate; and forming a first micro lens and a second micro lens both configured to focus light from the photo diode on the high- and low-sensitivity pixels, respectively, the first micro lens being larger than the second micro lens in area.

9. The method of claim 8, further comprising forming a plurality of the first pixel separation layers on a light illumination side in the semiconductor substrate in such a manner that an opening in the high-sensitivity pixel is larger than an opening in the low-sensitivity pixel.

10. The method of claim 8, wherein the second pixel separation layer is formed to have a width common to both the high-sensitivity pixel and the low-sensitivity pixel.

11. The method of claim 8, wherein a pixel center position of the first pixel separation layer is located so as to coincide with a lens end of each of the first and second micro lenses.

12. The method of claim 8, wherein the first micro lens and the second micro lens have a planar shape formed in such a manner that first micro lens and the second micro lens are arranged checkerwise.

13. A back side illumination type solid-state imaging device comprising:

a unit pixel comprising a high-sensitivity pixel and a low-sensitivity pixel with a lower sensitivity than the high-sensitivity pixel, wherein the high-sensitivity pixel comprises a first photo diode configured to photoelectrically convert incident light into charge which is accumulated, and a first read transistor connected to the first photo diode to read signal charge from the first photo diode, the low-sensitivity pixel comprises a second photo diode configured to have a lower photosensitivity than the first photo diode and to photoelectrically convert incident light into charge which is accumulated, and a second read transistor connected to the second photo diode to read signal charge from the second photo diode, each of the high-sensitivity pixel and the low-sensitivity element comprises a first pixel separation layer located on a light illumination surface side in the semiconductor substrate to separate pixels from each other, on the light illumination surface side of the semiconductor substrate, an opening between the first pixel separation layers in the high-sensitivity pixel is larger than an opening between the first pixel separation layers in the low-sensitivity pixel, and a plurality of the first pixel separation layers are further arranged on the light illumination surface side in the semiconductor substrate.

14. The device of claim 13, wherein the unit pixel further comprises:

a floating diffusion connected to the first read transistor and the second read transistor and in which the signal charge is accumulated;

a reset transistor configured to reset a potential of the floating diffusion; and an amplification transistor configured to amplify the potential of the floating diffusion.

15. The device of claim 14, wherein the unit pixel carries out a first operation mode in which a potential obtained by the floating diffusion by adding the signal charge in the first photo diode and the signal charge in the second photo diode together is amplified and in which a first resultant signal is output, and a second operation mode in which the potential of the floating diffusion into which the signal charge in the second photo diode is read by the second read transistor is amplified and in which a second resultant signal is output.

16. The device of claim 13, wherein each of the high-sensitivity pixel and the low-sensitivity pixel comprises a second pixel separation layer provided so as to surround the first and second photo diodes, respectively, and located in the semiconductor substrate so as to continue with the first pixel separation layer.

17. The device of claim 16, wherein the second pixel separation layer has a width common to both the high-sensitivity pixel and the low-sensitivity pixel.

18. The device of claim 13, wherein each of the high-sensitivity pixel and the low-sensitivity pixel further comprises a first micro lens and a second micro lens both configured to focus light on the photo diode, and
the first micro lens is larger than the second micro lens in area.

* * * * *